(12) United States Patent
Tsuruoka et al.

(10) Patent No.: US 8,710,666 B2
(45) Date of Patent: Apr. 29, 2014

(54) SEMICONDUCTOR DEVICE AND METHOD FOR FABRICATING THE SAME

(75) Inventors: Junji Tsuruoka, Aichi (JP); Kazuo Aoki, Aichi (JP); Masaki Ono, Tokyo (JP); Katsuhiko Yoshihara, Tokyo (JP)

(73) Assignees: Aisin AW Co., Ltd., Anjo (JP); Fuji Electric Co., Ltd., Kawasaki (JP)

( * ) Notice: Subject to any disclaimer, the term of this patent is extended or adjusted under 35 U.S.C. 154(b) by 184 days.

(21) Appl. No.: 12/801,603

(22) Filed: Jun. 16, 2010

(65) Prior Publication Data

US 2010/0295187 A1 Nov. 25, 2010

Related U.S. Application Data

(63) Continuation of application No. PCT/JP2008/072314, filed on Dec. 9, 2008.

(30) Foreign Application Priority Data

Dec. 20, 2007 (JP) .................................. 2007-328641

(51) Int. Cl.
*H01L 23/498* (2006.01)

(52) U.S. Cl.
USPC .................. 257/773; 257/696; 257/E21.509; 257/E21.517; 257/E23.024; 257/E23.068; 438/119; 438/666; 438/687

(58) Field of Classification Search
CPC .................. H01L 23/49838; H01L 23/49844; H01L 23/49811; H01L 23/49; H01L 23/50; H01L 2224/73213; H01L 2224/73221; H01L 2224/73215; H01L 2224/73265; H01L 2224/73271; H01L 2224/73263
USPC .......... 257/790, E23.129, 700–705, 690, 691, 257/779, 780, 784, 666, 667, 676, E21.518, 257/E23.02, 678, 685–687, 773, 787, 257/E23.001, E23.01, E23.023, E23.079, 257/E23.116, E23.123–E23.126, 257/E23.134–E23.136, E23.141, 692–698; 438/123, 611–614, 617, 618, 106, 438/125–127
See application file for complete search history.

(56) References Cited

U.S. PATENT DOCUMENTS 3,747,051 A * 7/1973 Swengel et al. .............. 439/750
4,751,199 A * 6/1988 Phy ................................ 29/827
(Continued)

FOREIGN PATENT DOCUMENTS

JP    63-002360    1/1988
JP    5-77944    10/1993
(Continued)

OTHER PUBLICATIONS

JPO AIPN, Machine Translation of Fujishima, Japanese Patent Publication 2006-73074, (translation date Mar. 16, 2013), all pages.*
(Continued)

*Primary Examiner* — Fernando L Toledo
*Assistant Examiner* — Victoria K Hall
(74) *Attorney, Agent, or Firm* — Staas & Halsey LLP

(57) ABSTRACT

A semiconductor device which can prevent a deterioration in the electrical properties by preventing sputters generated by laser welding from adhering to a circuit pattern or a semiconductor chip and a method for fabricating such a semiconductor device are provided. A connection conductor is bonded to a copper foil formed over a ceramic by a solder and resin is injected to a level lower than a top of the connection conductor. Laser welding is then performed. After that, resin is injected. This prevents sputters generated by the laser welding from adhering to a circuit pattern or a semiconductor chip. As a result, a deterioration in the electrical properties can be prevented.

6 Claims, 10 Drawing Sheets

(56) References Cited

U.S. PATENT DOCUMENTS

| | | | |
|---|---|---|---|
| 5,332,922 A * | 7/1994 | Oguchi et al. | 257/723 |
| 5,463,251 A * | 10/1995 | Fujita et al. | 257/717 |
| 5,473,190 A * | 12/1995 | Inoue et al. | 257/671 |
| 5,528,458 A * | 6/1996 | Yasuho et al. | 361/718 |
| 5,534,727 A * | 7/1996 | Inoue | 257/659 |
| 5,539,250 A * | 7/1996 | Kitano et al. | 257/666 |
| 5,554,885 A * | 9/1996 | Yamasaki et al. | 257/666 |
| 5,631,193 A * | 5/1997 | Burns | 29/827 |
| 5,661,337 A * | 8/1997 | Manteghi | 257/676 |
| 5,677,569 A * | 10/1997 | Choi et al. | 257/686 |
| 5,844,308 A * | 12/1998 | Dedert et al. | 257/692 |
| 6,256,200 B1 | 7/2001 | Lam et al. | 361/704 |
| 6,452,802 B2 * | 9/2002 | Lam et al. | 361/704 |
| 6,613,829 B2 | 9/2003 | Fukuizumi et al. | 524/439 |
| 6,707,166 B1 | 3/2004 | Noguchi | 257/790 |
| 6,818,968 B1 * | 11/2004 | Cheah | 257/666 |
| 6,903,440 B2 * | 6/2005 | Yoshida et al. | 257/593 |
| 6,963,125 B2 | 11/2005 | Featherby et al. | 257/680 |
| 6,972,372 B1 | 12/2005 | Tsai et al. | 174/551 |
| 6,995,041 B2 | 2/2006 | Connell et al. | 438/112 |
| 7,443,019 B2 * | 10/2008 | Bauer et al. | 257/692 |
| 7,619,314 B2 * | 11/2009 | Filoteo et al. | 257/777 |
| 7,642,641 B2 | 1/2010 | Mahler et al. | 257/701 |
| 7,868,471 B2 | 1/2011 | Camacho et al. | 257/790 |
| 7,906,860 B2 | 3/2011 | Meyer et al. | 257/790 |
| 8,004,075 B2 | 8/2011 | Soga et al. | 257/687 |
| 2002/0064903 A1* | 5/2002 | Kawata et al. | 438/107 |
| 2005/0098872 A1* | 5/2005 | Lien | 257/692 |
| 2007/0096293 A1* | 5/2007 | Wen et al. | 257/704 |
| 2008/0087994 A1* | 4/2008 | Yokomae et al. | 257/675 |
| 2008/0224282 A1* | 9/2008 | Ashida et al. | 257/669 |

FOREIGN PATENT DOCUMENTS

| | | | | |
|---|---|---|---|---|
| JP | 07-094845 | | 4/1995 | |
| JP | 2000-068447 | | 3/2000 | |
| JP | 2000-252410 | | 9/2000 | |
| JP | 2004-228461 | * | 8/2004 | H01L 23/48 |
| JP | 2006-74073 | * | 3/2006 | H01L 25/18 |
| JP | 2006-074073 | | 3/2006 | |
| JP | 2007-165690 | | 6/2007 | |

OTHER PUBLICATIONS

Patent Abstracts of Japan, Publication No. 07-094845, Published Apr. 7, 1995.

Patent Abstracts of Japan, Publication No. 2006-074073, Published Mar. 16, 2006.

Abstract of Japanese Publication No. 2000-068447 published on Mar. 3, 2000.

Patent Abstracts of Japan, Publication No. 2000-252410 published on Sep. 14, 2000.

Patent Abstracts of Japan, Publication No. 2007-165690 published on Jun. 28, 2007.

International Search Report mailed Feb. 24, 2009 in corresponding PCT Application No. PCT/JP2008/072314.

Patent Abstracts of Japan Publication No. 63-002360, published Jan. 7, 1988.

Japanese Office Action issued Oct. 2, 2012 in corresponding Japanese Patent Application No. 2009-547019.

* cited by examiner

SEMICONDUCTOR DEVICE AND METHOD FOR FABRICATING THE SAME

This application is a continuing application, filed under 35 U.S.C. §111(a), of International Application PCT/JP2008/072314, filed Dec. 9, 2008, which claims the priority of Japanese Patent Application No. 2007-328641, filed Dec. 20, 2007.

FIELD

The embodiments discussed herein are related to a semiconductor device, such as an IGBT (Insulated Gate Bipolar Transistor) or a PIM (Power Integrated Module), and a method for fabricating such a semiconductor device.

BACKGROUND

FIG. 9 is a fragmentary sectional view of a conventional semiconductor device. An assembly process of a conventional semiconductor device will be described. An insulated circuit board includes a back copper foil 3, a ceramic 4, and circuit patterns 5 and 6. The back copper foil 3 and a copper base 1 are bonded together by a solder 2 and the circuit pattern 5 and a semiconductor chip 8 are bonded together by a solder 7. The semiconductor chip 8 is a switching element such as an IGBT or a FWD (Free Wheeling Diode).

Usually these solder bonding steps are performed by a single heating process. After that, an emitter electrode (not illustrated) formed over the semiconductor chip 8 is connected to the circuit pattern 6 with a bonding wire 9 (aluminum wire, for example) by ultrasonic vibration.

A terminal case 10 in which external terminals 11 are insert-molded and the copper base 1 are then heat-bonded together with a silicone type adhesive (not illustrated). After that, the circuit pattern 5 and an external terminal 11 are bonded together at welding portions 12 by spot laser welding and the circuit pattern 6 and an external terminal 11 are bonded together at welding portions 12 by spot laser welding. In this laser welding, the upper side of each external terminal 11 is irradiated with laser light. The surface of the semiconductor chip 8 is then covered by injecting resin 17. The conventional semiconductor device is fabricated in this way.

Furthermore, a semiconductor element mounting board in which a board over which a wiring pattern for mounting a semiconductor element is formed and leads are bonded together by laser is disclosed in Japanese Laid-open Patent Publication No. 07-94845. With this semiconductor element mounting board, an end portion of a lead bonded to an electrode pad of the board is thinner than the rest of it.

Moreover, a method for fabricating a semiconductor device including a resin sealed body, first and second semiconductor chips which are inside the resin sealed body and on the front of the front and back of each of which an electrode is formed, a first lead which extends inside and outside the resin sealed body and which is electrically connected to an electrode of the first semiconductor chip, and a second lead which extends inside and outside the resin sealed body and which is electrically connected to an electrode of the second semiconductor chip is disclosed in Japanese Laid-open Patent Publication No. 2006-74073. With this method, the resin sealed body is formed in a state in which the first lead and the second lead overlap. After that, laser welding is performed on each of the first lead and the second lead. This prevents sputters which scatter from reaching a side of each semiconductor chip on which a circuit is formed.

The laser welding illustrated in the above FIG. 9 is performed before injecting resin 17. As illustrated in FIG. 10, when this laser welding is performed, sputters 21 which scatter will short-circuit the circuit patterns 5 and 6 (including a wiring pattern (not illustrated)) and the like formed over the insulating board (ceramic 4), break (blow) a wiring such as the bonding wire 9, or damage the semiconductor chip 8.

That is to say, the scattering of the sputters 21 will cause an insulation failure in the insulating board (ceramic 4), a short circuit between the circuit patterns 5 and 6, breaking of a wire wiring, physical damage (such as a mark of melting, a minute flaw, or a microcrack) to the semiconductor chip 8, and poor electrical properties (such as a short circuit) of the semiconductor chip 8.

SUMMARY

In order to solve the above problems, an object of the present invention is to provide a semiconductor device which can prevent a deterioration in the electrical properties by preventing sputters generated by laser welding from adhering to a circuit pattern or a semiconductor chip and a method for fabricating such a semiconductor device.

According to an aspect of the invention, there is provided a semiconductor device including: a circuit pattern formed over an insulating board; a semiconductor chip bonded over the circuit pattern; a connection conductor bonded to at least one of the circuit pattern and the semiconductor chip; an insulating resin which exposes a welding portion of the connection conductor and which covers the circuit pattern and the semiconductor chip; and an external terminal which passes a main electric current through a main electrode of the semiconductor chip and which is bonded to the welding portion of the connection conductor by laser welding.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Figure 9:
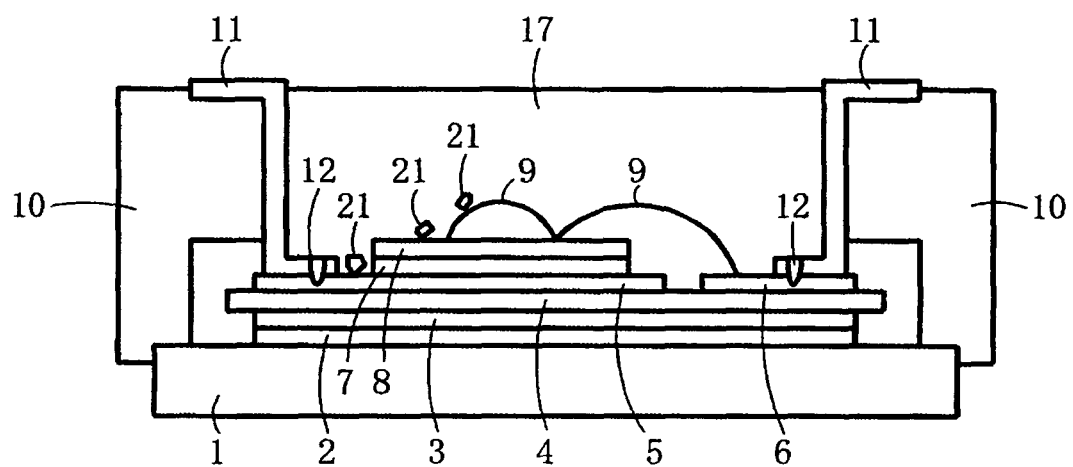
FIG. 9 is a fragmentary sectional view of a conventional semiconductor device.
Figure 10:
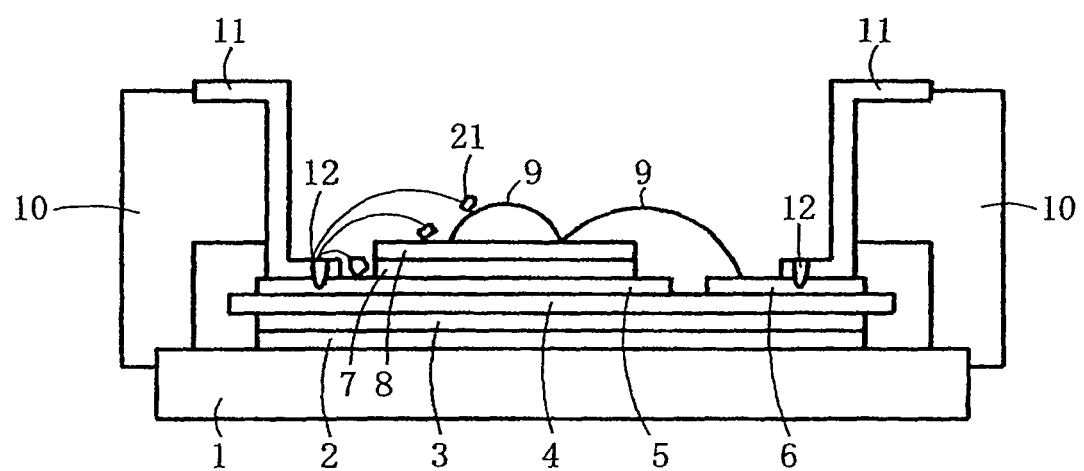
FIG. 10 illustrates how sputters scatter.

Embodiments will be described by giving the following examples. Members which are the same as those illustrated in FIG. 9 that illustrates the prior art are marked with the same numerals.

Example 1

Figure 1:
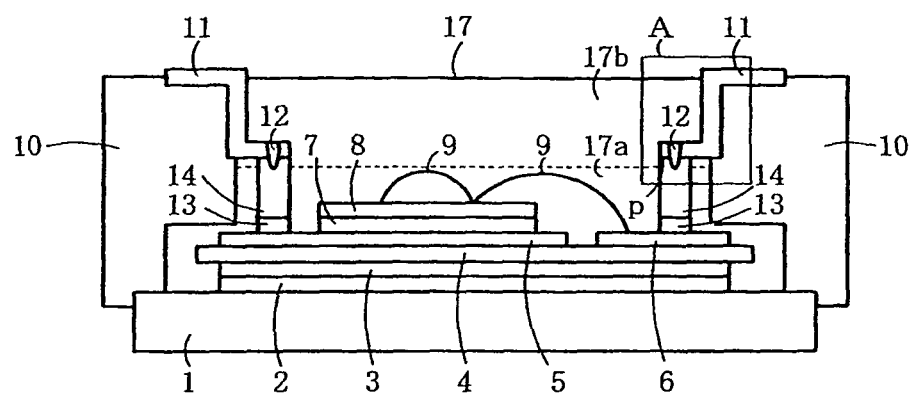
FIG. 1 is a fragmentary sectional view of a first example of a semiconductor device according to the present invention.

FIG. 1 is a fragmentary sectional view of a first example of a semiconductor device according to the present invention. Its basic structure is the same as that of the conventional semiconductor device illustrated in FIG. 9. However, the first example of the semiconductor device according to the present invention differs from the conventional semiconductor device in that a connection conductor 14 is inserted between a circuit pattern 5 and an external terminal 11 and that a connection conductor 14 is inserted between a circuit pattern 6 and an external terminal 11.

An insulated circuit board includes a ceramic (insulating board) 4, a back copper foil 3 formed on the back of the ceramic 4, and the circuit patterns 5 and 6 formed on the front of the ceramic 4. The back copper foil 3 of the insulated circuit board and a copper base 1 are bonded together by a solder 2 and the circuit pattern 5 and a semiconductor chip 8 are bonded together by a solder 7. The block-like connection conductor 14 and the circuit pattern 5 are bonded together by a solder 13. The block-like connection conductor 14 and the circuit pattern 6 are bonded together by the solder 13. The bonding by the solder 2 or 13 may be ultrasonic bonding.

An emitter electrode (not illustrated) formed over the semiconductor chip 8 is then connected to the circuit pattern 6 with a bonding wire (such as an aluminum wire) 9 by ultrasonic vibration.

A terminal case 10 in which external terminals 11 are insert-molded and the copper base 1 are then heat-bonded together with a silicone type adhesive (not illustrated). After that, resin 17a is injected so that a top P of each connection conductor 14 will be exposed and so that the bonding wire 9 will be buried (see FIG. 4A).

The connection conductors 14 and the external terminals 11 are then bonded together by spot laser welding. In this laser welding, the upper side of each external terminal 11 is irradiated with laser light. Metal which can be bonded easily to a circuit pattern and which can be bonded easily to the external terminals 11 by laser welding is selected as a material for the connection conductors 14. Metal which can be bonded easily to the connection conductors 14 by laser welding is selected as a material for the external terminals 11. From the viewpoint of making a main electric current flow to the outside, it is desirable that the metal should be highly conductive. Preferably, the metal is copper or a copper alloy. The external terminals 11 and the connection conductors 14 may be plated with nickel or the like with bondability taken into consideration.

The external terminals 11 are irradiated with laser light to weld the external terminals 11 and the connection conductors 14 together at welding portions 12. When the laser irradiation is performed, the external terminals 11 melt and part of them scatter as sputters 21. The sputters 21 which scatter adhere to the surface of the resin 17a. After that, resin 17b is injected as an upper-layer insulating resin (see FIG. 4B). The above resin 17a and the resin 17b are silicone gel or epoxy resin. The resin 17a and the resin 17b are made from the same materials. The resin 17a may be in a liquid state or a hardened state at the time of the laser welding. The resin 17a and the resin 17b may be made from different materials.

The step of removing the sputters 21 which adhere to the surface of the resin 17a may be added before injecting the resin 17b. For example, air is blown on the surface of the resin 17a to remove the sputters 21. If the resin 17a is hardened before the laser irradiation, it is easy to remove the sputters 21 by, for example, air.

The semiconductor device according to the present invention is fabricated in this way. The sputters 21 adhere to the surface of the resin 17a and the resin 17a functions as a mask. As a result, the sputters 21 do not reach the circuit pattern 5, the circuit pattern 6, the semiconductor chip 8, the bonding wire 9, or the like. Therefore, the sputters 21 do not cause damage to them.

That is to say, even if the sputters 21 are generated and scatter at the time of the laser welding, physical damage (such as a flaw, a crack, or cutting) to the circuit pattern 5, the circuit pattern 6, the semiconductor chip 8, or the bonding wire 9 caused by the sputters 21 can be prevented. As a result, a deterioration in the electrical properties (fall in breakdown voltage or non-continuity due to the breaking of a wire) can be prevented.

A modification in which a semiconductor chip 8, such as an IGBT, including one or more signal electrodes is mounted over a circuit pattern 5 will now be described.

Figure 2A:
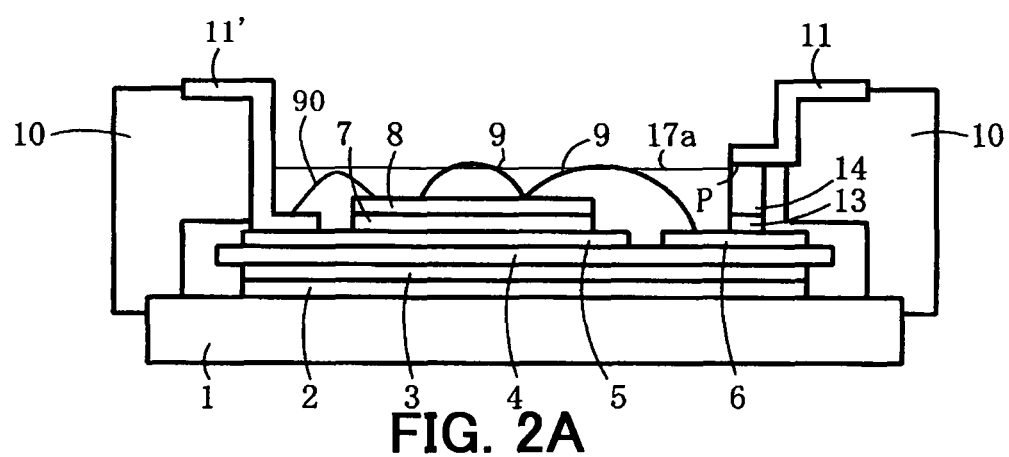
FIGS. 2A and 2B are fragmentary sectional views of a modification of the first example of the semiconductor device according to the present invention.
Figure 2B:
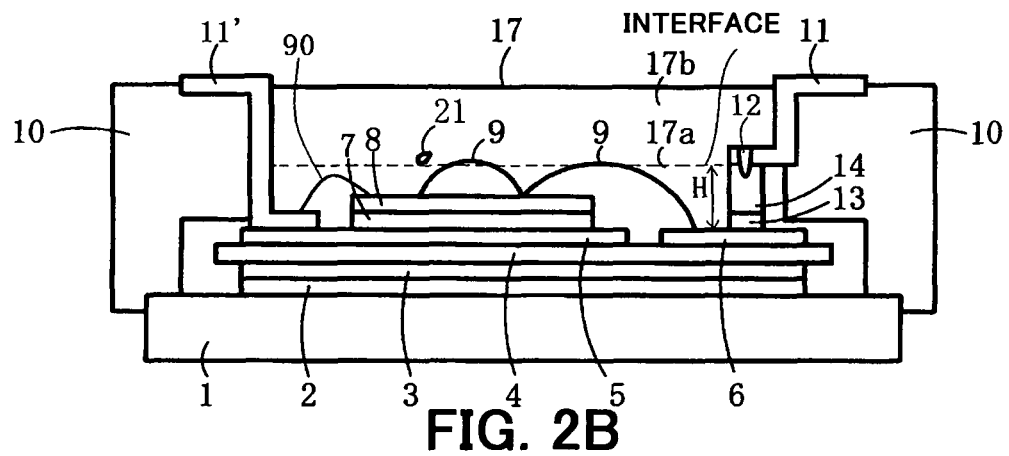

FIGS. 2A and 2B illustrate a modification of the first example of the semiconductor device according to the present invention. FIGS. 2A and 2B are fragmentary sectional views of a modification of the first example of the semiconductor device according to the present invention and illustrate the modification in order of step.

In addition to a main electrode, the semiconductor chip 8 has one or more signal electrodes over the surface over which the main electrode is arranged. Aside from a bonding wire 9 which connects the main electrode to a circuit pattern 6 for passing a main electric current, signal bonding wires 90 which connect the one or more signal electrodes to signal terminals 11' are connected. As illustrated in FIG. 2A, at least part of the signal terminals 11' electrically connected to the one or more signal electrodes of the semiconductor chip 8 or the bonding wires 90 electrically connected to the signal terminals 11' are covered with resin 17a.

Usually the bonding wire 9 which passes a main electric current is thicker than the bonding wires 90 connected to the one or more signal electrodes and a plurality of bonding wires 9 are connected to one main electrode. The thickness and number of bonding wires 9 are selected according to the intensity of an electric current which runs through a main electrode or the intensity of an electric current which can run through one bonding wire 9.

Unlike the bonding wire 9 connected to the main electrode, a powerful electric current does not run through each bonding wire 90 connected to a signal electrode. In addition, each signal electrode is small. Therefore, a thin wire is used.

In order to curb the influence of sputters 21 on each bonding wire, it is desirable that the above resin 17a should cover all bonding wires.

The bonding wire 9 which passes a main electric current is thicker and more rigid than each bonding wire 90 connected to a signal electrode. Therefore, the bonding wire 9 is less influenced by the collision of a sputter 21 than each bonding wire 90 connected to a signal electrode. Furthermore, adjacent bonding wires 9 are connected in parallel. Accordingly, even if a sputter 21 adheres to a bonding wire 9, the influence of a short circuit hardly arises.

The loop height of the bonding wire 9 is higher because of a difference in wire rigidity than that of each bonding wire 90 connected to a signal electrode. Therefore, a level to which the above resin 17a is injected is set so that the resin 17a will cover at least each bonding wire 90 connected to a signal electrode. The position H of a welding portion 12 is determined so that this level will be realized. By doing so, as illustrated in FIGS. 2A and 2B, the height of the semiconductor device can be reduced. In addition, each bonding wire 90 connected to a signal electrode can be protected reliably against a sputter 21.

As stated above, connection conductors 14 are bonded to the surface of a circuit pattern 5 and the surface of the circuit pattern 6 by solders 13. Solder-bonding the connection conductors 14 to the circuit patterns 5 and 6 can be performed in a step in which solder-bonding a copper base 1 to a back copper foil 3 and solder-bonding the semiconductor chip 8 to the circuit pattern 5 are performed.

That is to say, it is possible to solder-bond the connection conductors 14 to the circuit patterns 5 and 6 without adding a new solder bonding step.

External terminals 11 and the connection conductors 14 are bonded together by spot laser welding after the connection conductors 14 are solder-bonded to the circuit patterns 5 and 6 of an insulated circuit board. The thickness of the connection conductors 14 used is greater than or equal to that of the external terminal 11. As a result, the welding portion 12 does not reach the circuit pattern 5 or 6 or a circuit pattern (not illustrated), such as a circuit wiring, of the insulated circuit board under the connection conductor 14 and stable strong bonding can be realized by highly reliable laser welding.

Figure 3A:
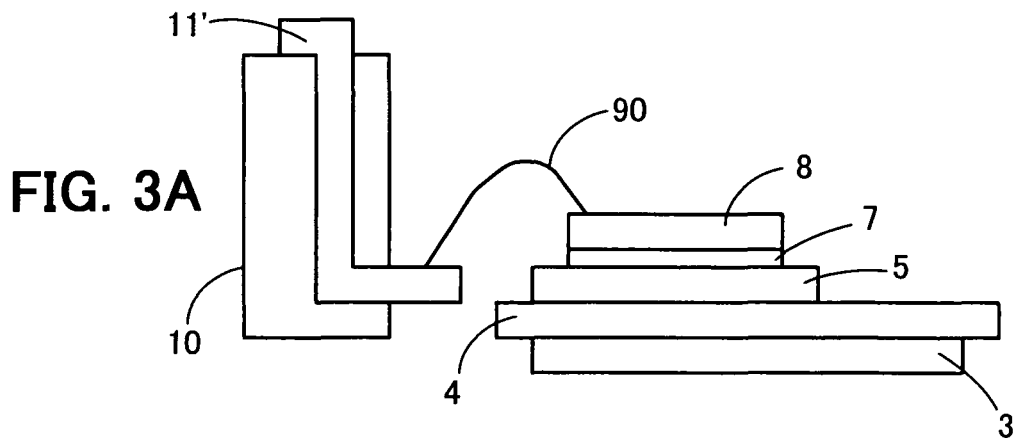
FIGS. 3A, 3B, and 3C are fragmentary sectional views of another modification of the first example of the semiconductor device according to the present invention.
Figure 3B:
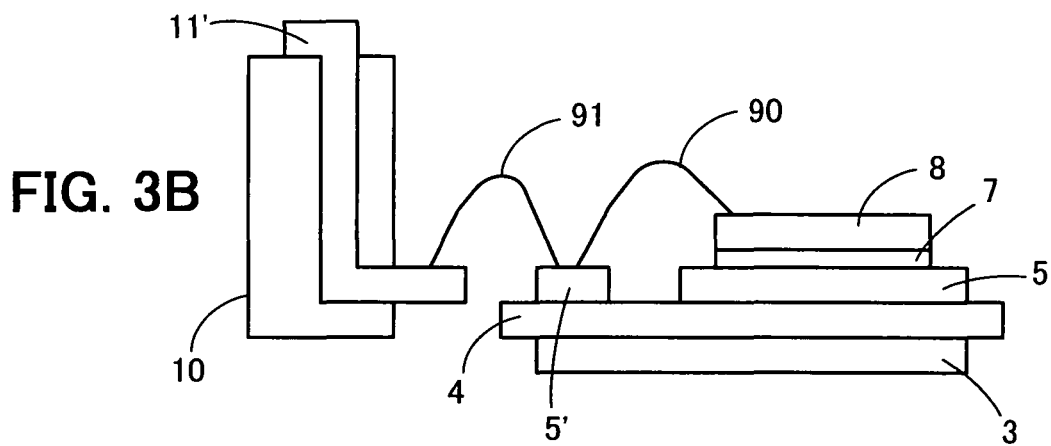
Figure 3C:
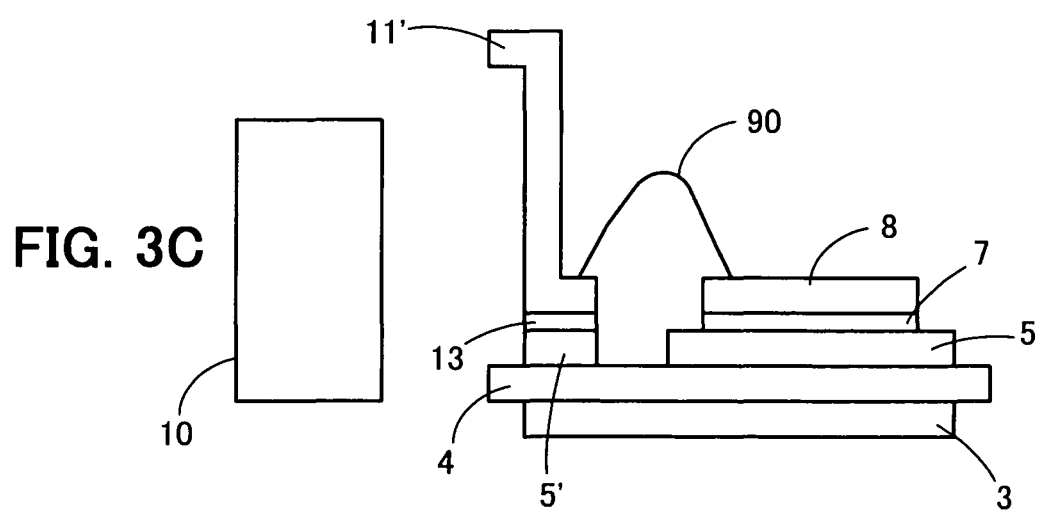

The semiconductor device including the signal terminals 11' may take forms illustrated in FIGS. 3A to 3C.

FIGS. 3A to 3C illustrate another modification of the first example of the semiconductor device according to the present invention. FIGS. 3A to 3C are sectional views of a portion of a semiconductor device around a signal terminal 11'. In FIGS. 3A to 3C, a copper base 1 is not illustrated.

As illustrated in FIG. 3A, for example, a signal terminal 11' integrally molded (sealed) in a terminal case 10 is electrically connected directly to a signal electrode of a semiconductor chip 8 via a bonding wire 90.

Furthermore, as illustrated in FIG. 3B, a circuit pattern 5' other than a circuit pattern 5 is formed over a ceramic 4 and is electrically connected directly to a signal electrode of a semiconductor chip 8 via a bonding wire 90. A signal terminal 11' integrally molded in a terminal case 10 is electrically connected to the circuit pattern 5' via a bonding wire 91.

Moreover, as illustrated in FIG. 3C, a signal terminal 11' may be bonded to a circuit pattern 5' via a solder 13. The signal terminal 11' may electrically be connected directly to a signal electrode of a semiconductor chip 8 via a bonding wire 90.

The semiconductor device may take these forms.

Figure 4A:
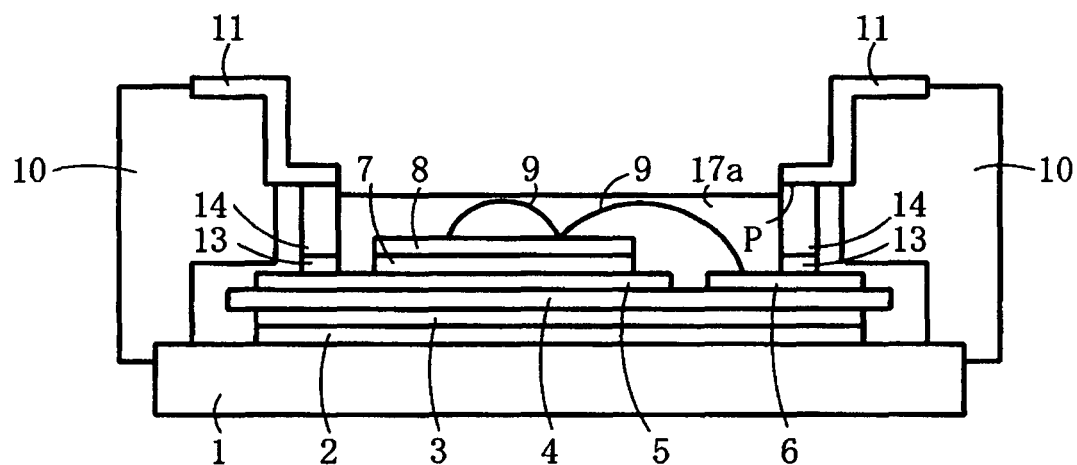
FIGS. 4A and 4B are views for illustrating a method for fabricating the semiconductor device illustrated in FIG. 1, each of FIGS. 4A and 4B being a fragmentary sectional view for illustrating a method for fabricating the semiconductor device illustrated in FIG. 1 in order of step.
Figure 4B:
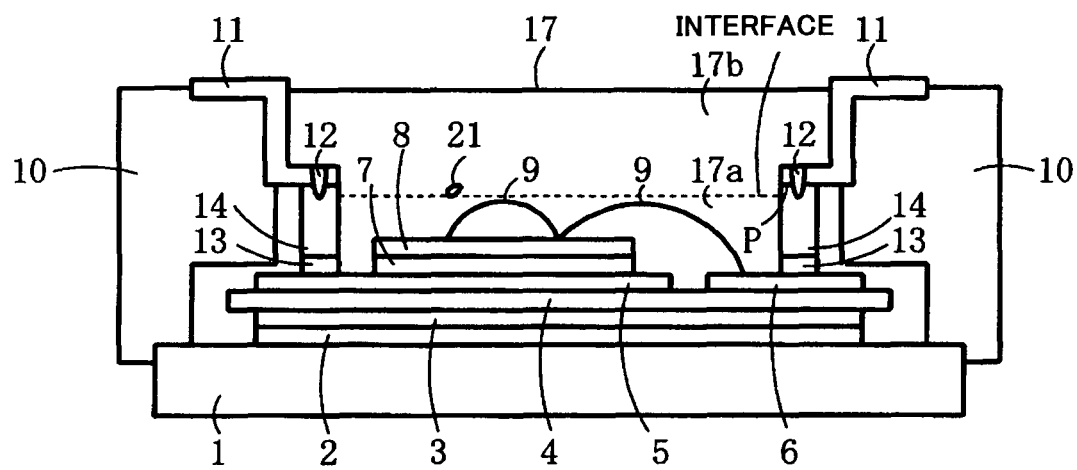

FIGS. 4A and 4B are views for describing a method for fabricating the semiconductor device illustrated in FIG. 1. Each of FIGS. 4A and 4B is a fragmentary sectional view for describing a method for fabricating the semiconductor device illustrated in FIG. 1 in order of step. Each component is described in the above FIG. 1.

The resin 17a is injected before the laser welding is performed. Therefore, the sputters 21 generated at the time of the laser welding adhere not to the circuit pattern 5 or 6 or the semiconductor chip 8 but to the surface of the resin 17a. This prevents a deterioration in the electrical properties. After that, the resin 17b is injected. As a result, an interface between the resin 17a and the resin 17b included in the resin 17 is contaminated with the sputters 21 and the sputters 21 are scattered on this interface.

Figure 5A:
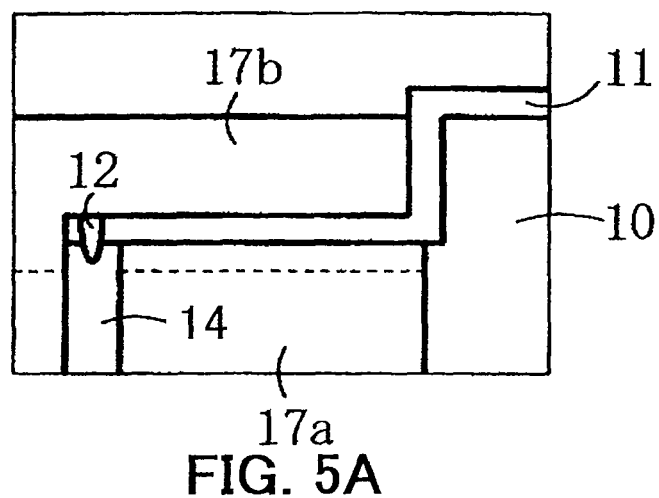
FIGS. 5A and 5B illustrate the structure of an A portion in the case of there being a great distance between a terminal case and a connection conductor, FIG. 5A being a view for illustrating the structure of an A portion in the case of an external terminal being extended, FIG. 5B being a view for illustrating the structure of an A portion in the case of an external connection conductor being used.
Figure 5B:
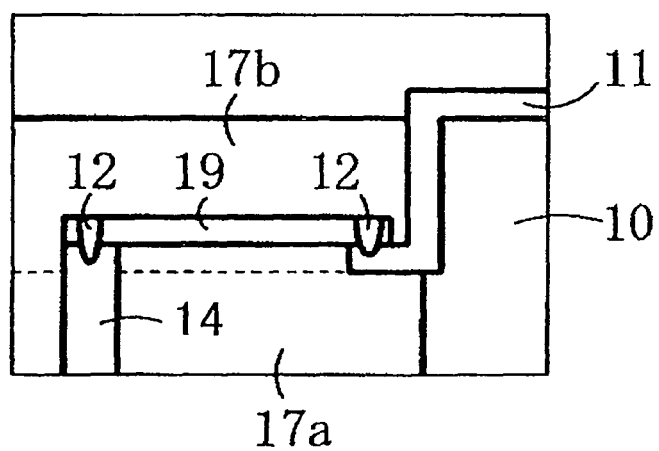

FIGS. 5A and 5B illustrate the structure of the A portion shown in FIG. 1 in the case of there being a great distance between the terminal case and the connection conductor. FIG. 5A is a view for illustrating the structure of the A portion in the case of the external terminal being extended. FIG. 5B is a view for illustrating the structure of the A portion in the case of an external connection conductor being used. If there is a great distance between the terminal case 10 and the connection conductor 14, the external terminal 11 should be extended to the connection conductor 14 as illustrated in FIG. 5A. Alternatively, as illustrated in FIG. 5B, an external connection conductor 19 is used for connecting the external terminal 11 to the connection conductor 14.

Example 2

Figure 6:
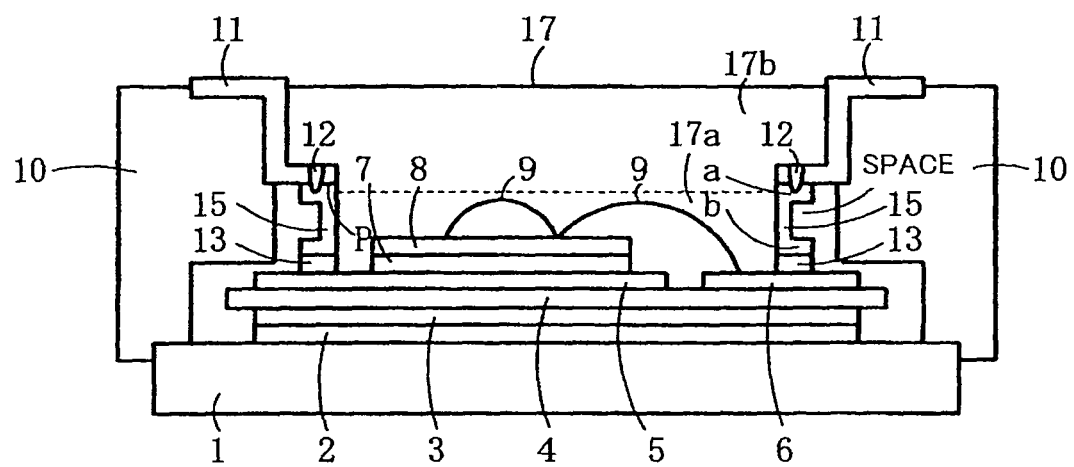
FIG. 6 is a fragmentary sectional view of a second example of the semiconductor device according to the present invention.

FIG. 6 is a fragmentary sectional view of a second example of the semiconductor device according to the present invention. The second example differs from the first example illustrated in FIG. 1 in that a connection conductor 15 bonded to an external terminal 11 by spot laser welding has the shape of the letter "U." The reason for referring to the shape of the connection conductor 15 as the shape of the letter "U" is that the connection conductor 15 has the shape of the letter "U" which has fallen sidelong. A side solder-bonded to a circuit pattern 5 and a side (P) welded at a welding portion 12 connect with a space between by a portion (connection portion) which rises from the circuit pattern side. The connection conductor 15 has the shape of the letter "U," so the surface (top P) of an upper flat portion of the U-connection conductor 15 is held down at the time of laser welding by an external connection conductor (lead frame) which is placed over the connection conductor 15. As a result, the upper flat portion bends and the connection conductor 15 adheres strongly to the external terminal 11 across the face of the laser welding. Accordingly, laser welding can be performed properly.

If the thickness of the U-connection conductor 15, the state of the surface of a material for the U-connection conductor 15, or laser power varies, the upper flat portion "a" of the U-connection conductor 15 may melt at the time of the laser welding and a penetration may be formed at the center of the welding portion 12. In this case, a lower flat portion "b" of the U-connection conductor 15 is irradiated with laser light via the penetration.

However, laser light is not focused on the lower flat portion "b" of the U-connection conductor 15. Accordingly, its energy becomes lower and the lower flat portion b of the U-connection conductor 15 does not melt. Inserting the U-connection conductor 15 in this way prevents the welding portion 12 from reaching the circuit pattern 5 or a circuit pattern 6 of an insulated circuit board. Therefore, stable strong bonding can be realized by highly reliable laser welding.

In this case, resin 17a is injected before the laser welding to a level lower than the surface (top P) of the upper flat portion of the U-connection conductor 15 so that the resin 17a will cover a bonding wire 9. After the laser welding is performed, resin 17b is injected over the resin 17a. This is the same with the first example. This prevents sputters 21 generated at the time of the laser welding from adhering to the surface of a circuit pattern (circuit pattern 5 or 6 or a circuit wiring pattern (not illustrated)) or a semiconductor chip 8 of the insulated circuit board or breaking the bonding wire 9.

Example 3

Figure 7A:
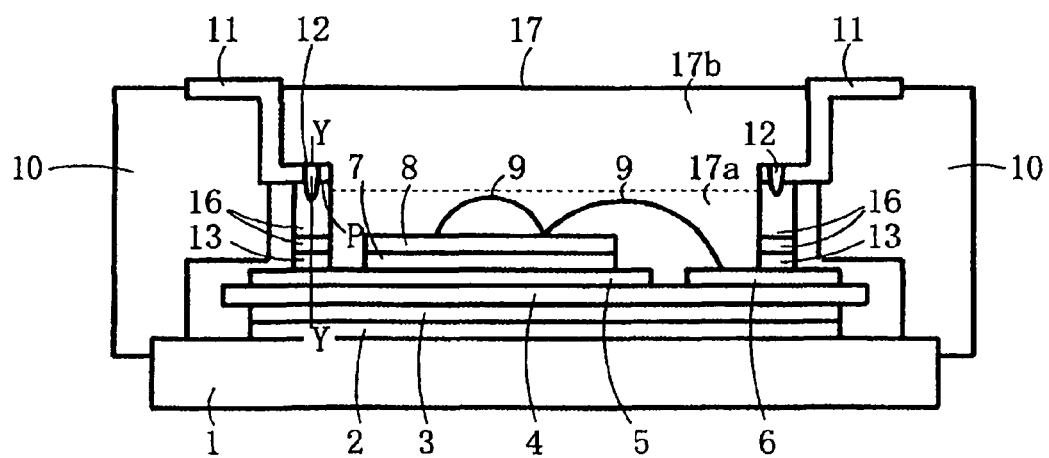
FIGS. 7A and 7B illustrate the structure of a third example of the semiconductor device according to the present invention, FIG. 7A being a fragmentary sectional view of a third example of the semiconductor device according to the present invention, FIG. 7B being a fragmentary sectional view taken along the line Y-Y of FIG. 5A.
Figure 7B:
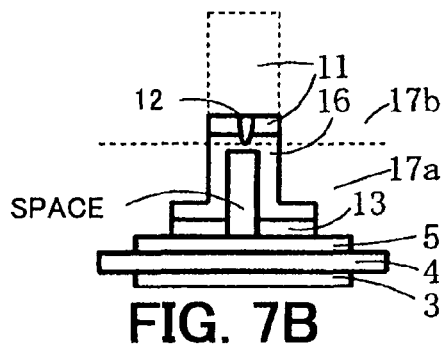

FIGS. 7A and 7B illustrate the structure of a third example of the semiconductor device according to the present invention. FIG. 7A is a fragmentary sectional view of a third example of the semiconductor device according to the present invention. FIG. 7B is a fragmentary sectional view taken along the line Y-Y of FIG. 5A. The third example differs from the first example illustrated in FIG. 1 and the second example illustrated in FIG. 6 in that a connection conductor 16 has an Ω-type shape. The reason for referring to the shape of the connection conductor 16 as an Ω type is that the connection conductor 16 has a shape similar to the letter "Ω." A side solder-bonded to a circuit pattern 5 and a side (P) welded at a welding portion 12 connect with a space between by a portion (connection portion) which rises from the circuit pattern side. The Ω-type connection conductor 16 is bonded to an external terminal 11 at a welding portion 12 by laser welding. Resin 17a is injected before the laser welding to a level which is lower than the surface (top P) of an upper flat portion of the Ω-type connection conductor 16. This prevents damage or a defect caused by sputters 21. Resin 17b is injected over the resin 17a after the laser welding.

The Ω-type connection conductors 16 are bonded to the circuit pattern 5 and a circuit pattern 6 by solders 13. In this case, the thin circuit pattern 5 or 6 is not welded to the thick external terminal 11. The thick Ω-type connection conductor 16 is inserted between the circuit pattern 5 or 6 and the external terminal 11. This is the same with the case where the U-connection conductor is used. This prevents the welding portion 12 from reaching the circuit pattern 5 or 6 of an insulated circuit board. This is the same with the case where the U-connection conductor is inserted. As a result, stable strong bonding can be realized by highly reliable laser welding. The thickness of the Ω-type connection conductor 16 is greater than or equal to that of the external terminal 11.

The same effect that is obtained by the U-connection conductor indicated in the above example 2 or the Ω-type connection conductor indicated in the above example 3 can be achieved by the following connection conductor 14. A space is formed in a connection conductor 14 (not illustrated) between a side bonded to a circuit pattern or a semiconductor chip and a side on which laser welding is performed so that the space will be located on an extension line of an optical path of laser light. In addition, a part of the side wall of a connection conductor 14 having the shape of a cylinder or a square pole may be cut to form a slit-like opening (not illustrated).

Moreover, a hollow pipe a cross section of which is square may be cut to obtain a connection conductor. One side of this connection conductor is solder-bonded to a circuit pattern 5 or 6 and an external terminal 11 is bonded to the other side by spot laser welding.

This hollow pipe can be obtained only by cutting a long pipe, so it can be prepared inexpensively. In addition, a cross section of the hollow pipe is square, so there is a space on an extension line of an optical path of laser light. Accordingly, the same effect can be obtained.

Example 4

Figure 8A:
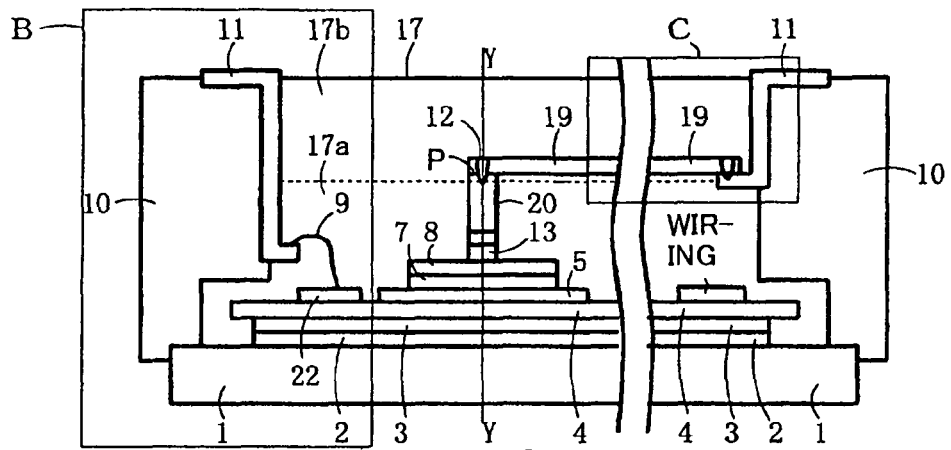
FIGS. 8A, 8B, 8C, and 8D illustrate the structure of a fourth example of the semiconductor device according to the present invention, FIG. 8A being a fragmentary sectional view of the structure of a fourth example of the semiconductor device according to the present invention, FIG. 8B being a fragmentary sectional view taken along the line Y-Y of FIG. 8A, FIG. 8C being a fragmentary sectional view of the structure of a fourth example of the semiconductor device according to the present invention in which a change is made in the structure of the B portion of FIG. 8A, and FIG. 8D being a fragmentary sectional view of the structure of a fourth example of the semiconductor device according to the present invention in which a change is made in the structure of the C portion of FIG. 8A.
Figure 8B:
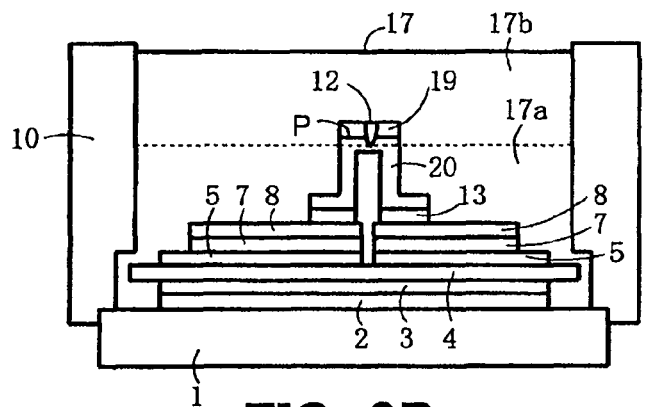
Figures 8C, 8D:
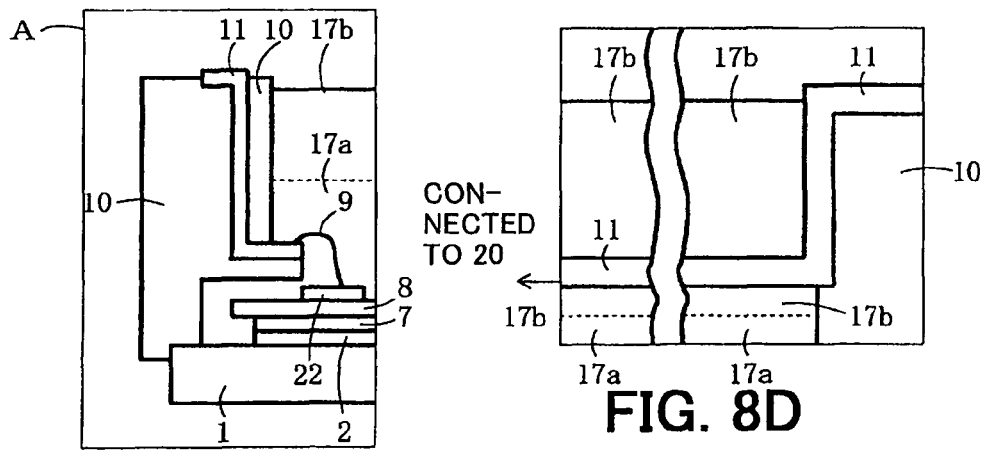

FIGS. 8A, 8B, 8C, and 8D illustrate the structure of a fourth example of the semiconductor device according to the present invention. FIG. 8A is a fragmentary sectional view of the structure of a fourth example of the semiconductor device according to the present invention. FIG. 8B is a fragmentary sectional view taken along the line Y-Y of FIG. 8A. FIG. 8C is a fragmentary sectional view of the structure of a fourth example of the semiconductor device according to the present invention in which a change is made in the structure of the B portion of FIG. 8A. FIG. 8D is a fragmentary sectional view of the structure of a fourth example of the semiconductor device according to the present invention in which a change is made in the structure of the C portion of FIG. 8A. In FIG. 8A, two semiconductor chips are connected by an Ω-type connection conductor 20 and the Ω-type connection conductor 20 is bonded to an external connection conductor (lead frame) 19 by laser welding. FIG. 8B indicates a state in which the two semiconductor chips 8 (for example, an IGBT chip and a diode chip) are bonded to two feet of the)-type connection conductor 20 by solders 13. FIG. 8C illustrates the case where a portion at which an external terminal 11 embedded in a terminal case 10 and a bonding wire 9 are connected is exposed from the terminal case 10. Usually a terminal case has a structure like that illustrated in FIG. 8C.

The Ω-type connection conductor 20 is bonded to the external connection conductor (metal plate or a lead frame connected to the external terminal 11) 19 at a welding portion 12 by laser welding. Resin 17a is injected before the laser welding to a level which is lower than the surface (top P) of an upper flat portion of the Ω-type connection conductor 20. This prevents damage or a defect caused by sputters 21. Resin 17b is injected over the resin 17a after the laser welding. The external terminal 11 and a pad (such as a gate pad) 22 formed over a ceramic 4 are connected by the bonding wire 9 which is buried in the resin 17a.

In FIG. 8A, the Ω-type connection conductor 20 and the external terminal 11 are connected by the external connection conductor 19. As illustrated in FIG. 8D, however, there is no need to use the external connection conductor 19. That is to say, the external terminal 11 is extended to the Ω-type connection conductor 20 and is connected directly to the Ω-type connection conductor 20.

Preferably, connection conductors such as the above connection conductor 14, U-connection conductor 15, Ω-type connection conductors 16 and 20, and hollow pipe (not illustrated) are made of a low electric resistance material (material having a high electric conductivity) such as copper or an alloy of copper. In addition, an aluminum wire is bonded to the upper side of the above semiconductor chip 8. However, a wiring of a lead frame may be bonded to the upper side of the above semiconductor chip 8.

Preferably, the wavelength of laser light used in the above spot laser welding is 0.19 to 10.6 μm.

According to the present invention, injecting an insulating resin is performed by two steps. First injecting is performed so that an injecting level will be lower than the top of a lower member on which laser welding is to be performed. Laser welding is performed in this state. After that, second injecting is performed by adding an insulating resin. Even if sputters scatter at the time of the laser welding, the sputters do not cause physical damage (such as a flaw, a crack, or cutting) to a circuit pattern, a semiconductor chip, a bonding wire, or the like and a deterioration in electrical properties (fall in breakdown voltage or non-continuity due to the breaking of a wire) can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. A semiconductor device comprising:
a circuit pattern formed over an insulating board;
a semiconductor chip bonded to a main surface of the circuit pattern;
a connection conductor which has an Ω-type shape whose two lower ends are bonded to the main surface of the circuit pattern;
a first insulating resin which exposes an upper-end welding portion of the connection conductor through a top of the first insulating resin and which covers the circuit pattern and the semiconductor chip,
wherein the upper-end welding portion and the top of the first insulating resin are parallel to the main surface of the circuit pattern; and
an external terminal which passes a main electric current through a main electrode of the semiconductor chip and which is bonded to the upper-end welding portion of the connection conductor.

2. The semiconductor device according to claim 1, further comprising a second upper-layer insulating resin which is over the first insulating resin and which covers the exposed portion of the connection conductor and a portion of the external terminal.

3. The semiconductor device according to claim 1, wherein:
the semiconductor chip includes one or more signal electrodes in addition to the main electrode; and
the first insulating resin covers at least one bonding wire, each bonding wire connecting only one of the one or more signal electrodes and signal terminals.

4. A semiconductor device comprising:
a circuit pattern formed over an insulating board;
a semiconductor chip bonded to a main surface of the circuit pattern;
a first connection conductor which has an Ω-type shape whose two lower ends are bonded to the main surface of the circuit pattern;
a first insulating resin which exposes an upper-end welding portion of the first connection conductor through a top surface of the first insulating resin and which covers the circuit pattern and the semiconductor chip,
wherein the upper-end welding portion and the top of the first insulating resin are parallel to the main surface of the circuit pattern;
an external terminal which passes a main electric current through a main electrode of the semiconductor chip; and
a second external connection conductor bonded to the external terminal and the upper-end welding portion of the first connection conductor.

5. The semiconductor device according to claim 4, further comprising a second upper-layer insulating resin which is over the first insulating resin and which covers the exposed portion of the first connection conductor, a portion of the external terminal, and the second external connection conductor.

6. The semiconductor device according to claim 4, wherein:
the semiconductor chip includes one or more signal electrodes in addition to the main electrode; and
the first insulating resin covers at least one bonding wire, each bonding wire connecting only one of the one or more signal electrodes and signal terminals.

* * * * *